United States Patent
Takeuchi (10) Patent No.: US 11,742,821 B2
(45) Date of Patent: Aug. 29, 2023

(54) MULTIPLEXER, FILTER, AND COMMUNICATION MODULE

(71) Applicant: TAIYO YUDEN CO., LTD., Tokyo (JP)

(72) Inventor: Hirotaka Takeuchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 173 days.

(21) Appl. No.: 16/903,207

(22) Filed: Jun. 16, 2020

(65) Prior Publication Data

US 2020/0403597 A1    Dec. 24, 2020

(30) Foreign Application Priority Data

Jun. 24, 2019    (JP) ................................ 2019-116653

(51) Int. Cl.
| | |
|---|---|
| *H03H 7/46* | (2006.01) |
| *H03H 11/04* | (2006.01) |
| *H04B 1/48* | (2006.01) |
| *H03H 7/01* | (2006.01) |
| *H04B 1/00* | (2006.01) |

(52) U.S. Cl.
CPC .......... *H03H 7/465* (2013.01); *H03H 7/0115* (2013.01); *H03H 11/04* (2013.01); *H04B 1/0057* (2013.01); *H04B 1/48* (2013.01)

(58) Field of Classification Search
CPC ...... H03H 7/465; H03H 7/0115; H03H 11/04; H04B 1/0057; H04B 1/48
See application file for complete search history.

(56) References Cited

U.S. PATENT DOCUMENTS

| | | | |
|---|---|---|---|
| 8,160,511 B2* | 4/2012 | Uejima .................... | H04B 1/44 333/132 |
| 2017/0126198 A1* | 5/2017 | Mukai .................. | H03H 7/0115 |

(Continued)

FOREIGN PATENT DOCUMENTS

| | | |
|---|---|---|
| JP | 2002-43883 A | 2/2002 |
| JP | 2018-007045 A | 1/2018 |

OTHER PUBLICATIONS

Japanese Office Action dated May 23, 2023, in a counterpart Japanese patent application No. 2019-116653. (A machine translation (not reviewed for accuracy) attached.).

*Primary Examiner* — Patrick C Chen
(74) *Attorney, Agent, or Firm* — Chen Yoshimura LLP (57) ABSTRACT

A multiplexer includes: a multilayered body including dielectric layers stacked and having first and second surfaces; a common terminal, a first terminal, a second terminal, and a ground terminal disposed on a surface of the multilayered body; a first filter disposed in the multilayered body and electrically connected between the common terminal and the first terminal; a second filter including: a first inductor electrically connected between the common terminal and the second terminal; and a second inductor connected in series with the first inductor between the first inductor and the second terminal, the second inductor at least partially overlapping with the first inductor, a capacitance between a first end of the second inductor electrically closer to the common terminal and the ground terminal being larger than a capacitance between a first end of the first inductor electrically closer to the common terminal and the ground terminal.

11 Claims, 10 Drawing Sheets

(56) References Cited

U.S. PATENT DOCUMENTS

| | | | |
|---|---|---|---|
| 2020/0252041 A1* | 8/2020 | Ishizuka | H03H 7/1775 |
| 2020/0389145 A1* | 12/2020 | Takahashi | H03H 7/1725 |
| 2021/0036676 A1* | 2/2021 | Tanaka | H03H 7/0115 |

* cited by examiner

MULTIPLEXER, FILTER, AND COMMUNICATION MODULE

CROSS-REFERENCE TO RELATED APPLICATION

This application is based upon and claims the benefit of priority of the prior Japanese Patent Application No. 2019-116653, filed on Jun. 24, 2019, the entire contents of which are incorporated herein by reference.

FIELD

A certain aspect of the present embodiments relates to a multiplexer, a filter and a communication module.

BACKGROUND

Filters that remove unnecessary interfering waves and multiplexers such as diplexers are used in wireless communication terminals such as smartphones and mobile phones. It has been known to use a multilayered body formed of stacked dielectric layers as a filter and a diplexer, as disclosed in Japanese Patent Application Publication No. 2002-43883.

SUMMARY

According to a first aspect of the present embodiments, there is provided a multiplexer including: a multilayered body including a plurality of dielectric layers stacked in a vertical staking direction; a common terminal, a first terminal, a second terminal, and a ground terminal that are disposed on a surface of the multilayered body; a first filter constructed within the multilayered body and electrically connected between the common terminal and the first terminal; and a second filter constructed within the multilayered body, including: a first inductor constructed within the multilayered body, disposed in an electrical path connecting the common terminal to the second terminal, and a second inductor constructed within the multilayered body, connected in series with the first inductor along said electrical path between the first inductor and the second terminal, at least a part of the second inductor overlapping with at least a part of the first inductor in the stacking direction, a capacitance formed between a first end of the second inductor connected to the first inductor and the ground terminal being larger than a capacitance formed between a first end of the first inductor that is closer to the common terminal along said electrical path and the ground terminal.

According to a second aspect of the present embodiments, there is provided a filter including: a multilayered body including a plurality of dielectric layers stacked in a vertical stacking direction; a first signal terminal, a second signal terminal, and a ground terminal that are disposed on a surface of the multilayered body, the first signal terminal being to be electrically connected to an antenna; a first inductor constructed within the multilayered body, disposed in an electrical path connecting the first signal terminal to the second signal terminal; and a second inductor constructed within the multilayered body, connected in series with the first inductor along said electrical path between the first inductor and the second signal terminal, at least a part of the second inductor overlapping with at least a part of the first inductor in the stacking direction, a capacitance formed between a first end of the second inductor connected to the first inductor and the ground terminal being larger than a capacitance formed between a first end of the first inductor that is closer to the first signal terminal along said electrical path and the ground terminal.

According to a third aspect of the present embodiments, there is provided a multiplexer including: a multilayered body including a plurality of dielectric layers each having a conductive pattern or patters thereon, stacked in a vertical staking direction; a common terminal, a first terminal, a second terminal, and a ground terminal that are disposed on a bottom surface of the multilayered body; a first filter constructed of a set of the conductive patterns on the plurality of dielectric layers in the multilayered body and electrically connected between the common terminal and the first terminal; and a second filter constructed of another set of the conductive patterns on the plurality of dielectric layers in the multilayered body, the second filter including: a first inductor formed in the multilayered body, one end of the first inductor being connected to the common terminal; a second inductor formed in the multilayered body having one end thereof connected to another end of the first inductor so as to be connected in series with the first inductor, another end of the second inductor being connected to the second terminal, the second inductor being formed in a layer or layers that are above a layer or layers in which the first inductor is formed such that the second inductor at least partially overlaps with the first inductor in a plan view; and a capacitor formed in the multilayered body, connected between the ground terminal and a node that connects the first inductor and the second inductor in series, the capacitor being formed in layers that are below the layer or layers in which the first inductor is formed, and having a capacitance that is greater than a capacitance formed between the ground terminal and said one end of the first inductor connected to the common terminal, said capacitance formed between the ground terminal and said one end of the first inductor being formed only by a parasitic capacitance formed within the multilayered body, or formed by another capacitor physically formed within the multilayered body, connected between the ground terminal and said one end of the first inductor.

According to a fourth aspect of the present embodiments, there is provided a communication module including: one of the above-mentioned multiplexer; and a shield electrode provided above the top surface, one of an air gap and an insulator being interposed between the shield electrode and the second surface, the insulator being made of a material different from a material of the multilayered body.

DETAILED DESCRIPTION

A multiplexer may have a change in characteristics when a conductor having a reference potential, such as but not limited to a shield, is arranged near a multilayered body in which the multiplexer is formed.

Hereinafter, a description will be given of embodiments with reference to the accompanying drawings.

First Embodiment

Figure 1:
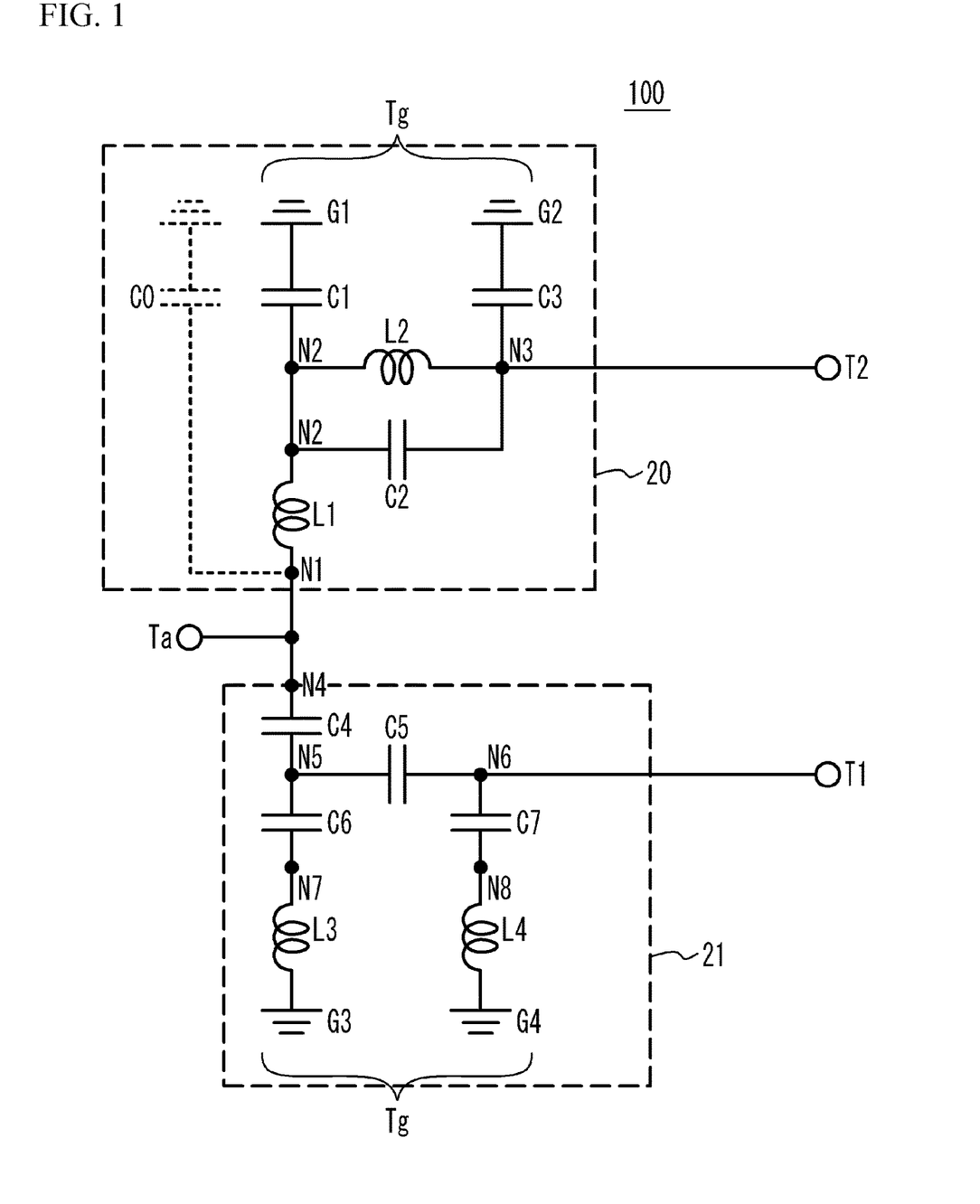
FIG. 1 is a circuit diagram of a multiplexer in accordance with a first embodiment.

A first embodiment is an exemplary diplexer including a low-pass filter (LPF) and a high-pass filter (HPF). FIG. 1 is a circuit diagram of a multiplexer in accordance with the first embodiment. As illustrated in FIG. 1, a multiplexer 100 includes terminals T1 and T2, a common terminal Ta, a ground terminal Tg, and filters 20 and 21. Grounds G1 to G4 are coupled to the ground terminal Tg.

The filter 21 is connected between the common terminal Ta and the terminal T1. The filter 20 is connected between the common terminal Ta and the terminal T2. The filter 20 is a low-pass filter (LPF), and the filter 21 is a high-pass filter (HPF). The passband of the filter 20 is lower than that of the filter 21.

The filter 20 transmits signals in the passband to the terminal T2 among high-frequency signals input to the common terminal Ta, and suppresses signals in other frequency bands including the passband of the filter 21. The filter 21 transmits signals in the passband to the terminal T1 among high-frequency signals input to the common terminal Ta, and suppresses signals in other frequency bands including the passband of the filter 20. The filters 20 and 21 respectively transmit signals in their passbands to the common terminal Ta among high-frequency signals input from the terminals T1 and T2, and suppress signals in other frequency bands in the same manner.

The filter 20 includes inductors L1 and L2, and capacitors C1 to C3. The inductors L1 and L2 are connected in series between the common terminal Ta and the terminal T2. The capacitor C1 is connected between a node N2, which is between the inductors L1 and L2, and the ground G1. The capacitor C2 is connected in parallel to the inductor L2. The capacitor C3 is connected between a node N3, which is closer to the terminal T2, of the inductor L2 and the ground G2. Although no capacitor is connected between a node N1, which is closer to the common terminal Ta, of the inductor L1 and a ground, there is a capacitance C0 corresponding to a parasitic capacitance.

The filter 21 includes inductors L3 and L4, and capacitors C4 to C7. The capacitors C4 and C5 are connected in series between the common terminal Ta and the terminal T1. The capacitor C6 is connected between a node N5, which is between the capacitors C4 and C5, and a node N7. The inductor L3 is connected between the node N7 and the ground G3. The capacitor C7 is connected between a node N6, which is closer to the terminal T1, of the capacitor C5 and a node N8. The inductor L4 is connected between the node N8 and the ground G4.

Figure 2:
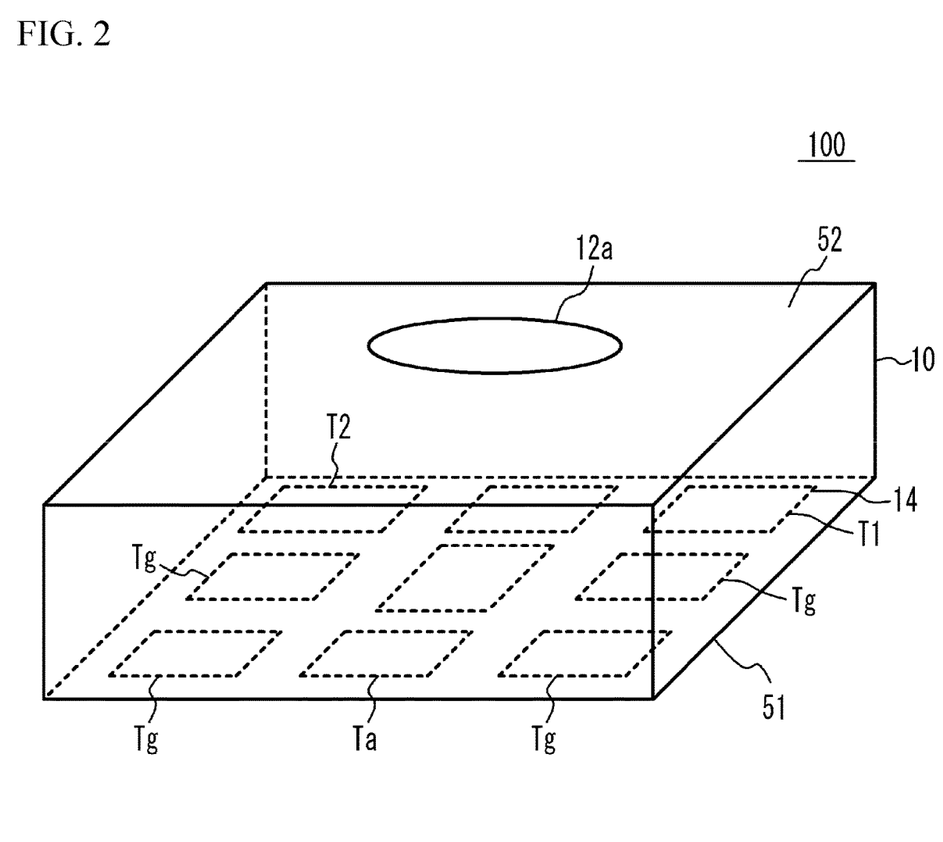
FIG. 2 is a perspective view of the multiplexer in accordance with the first embodiment.

FIG. 2 is a perspective view of the multiplexer in accordance with the first embodiment. As illustrated in FIG. 2, the multiplexer 100 includes a multilayered body 10. Terminals 14 are disposed on a lower surface (bottom surface) 51 of the multilayered body 10. The terminals 14 include, for example, the common terminal Ta, the terminals T1 and T2, and the ground terminal Tg. A conductive pattern 12a, which may be used as an orientation identification mark, is provided on an upper surface (top surface) 52 of the multilayered body 10.

Figure 3A:
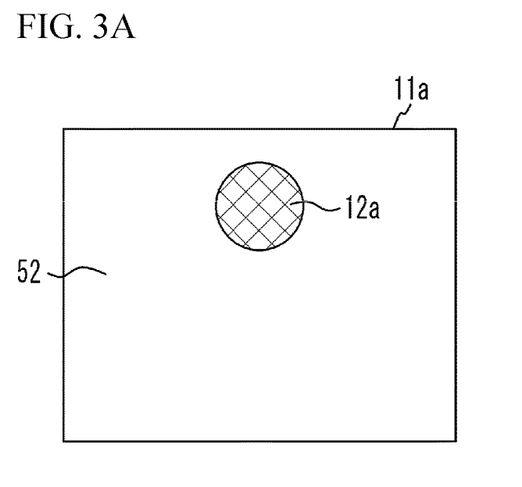
FIG. 3A through FIG. 3F are plan views illustrating each dielectric layer in a multilayered body of the multiplexer in accordance with the first embodiment.
Figure 3B:
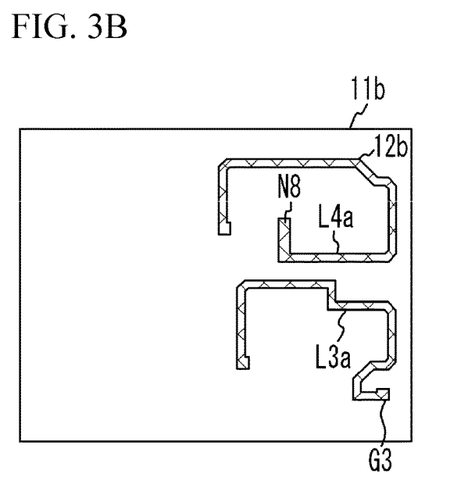
Figure 3C:
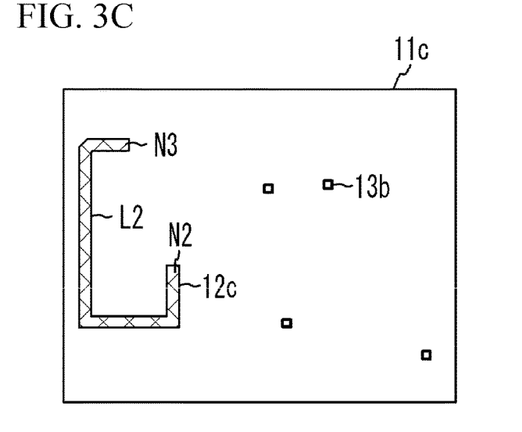
Figure 3D:
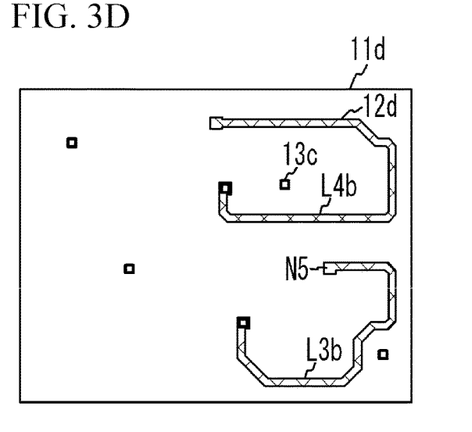
Figure 3E:
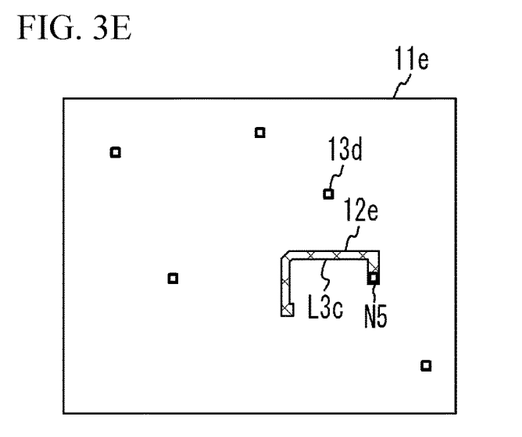
Figure 3F:
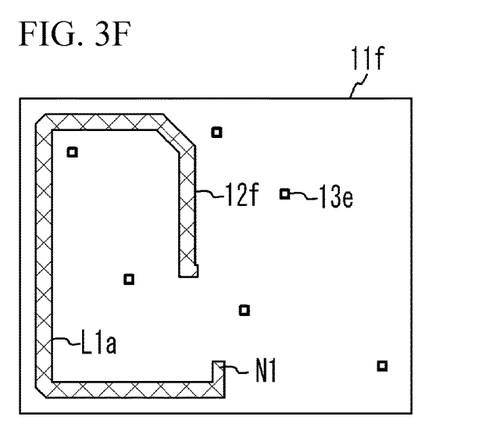
Figure 4A:
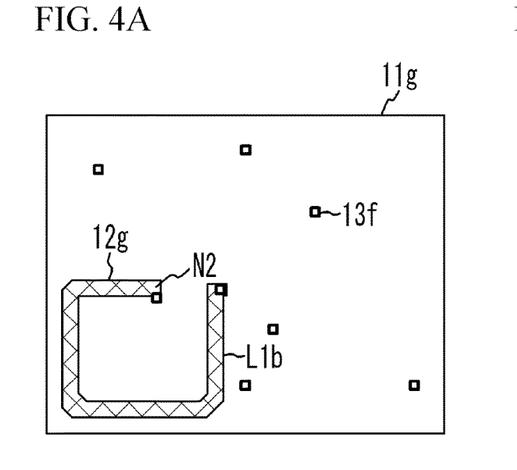
FIG. 4A through FIG. 4E are plan views illustrating each dielectric layer in the multilayered body of the multiplexer in accordance with the first embodiment.
Figure 4B:
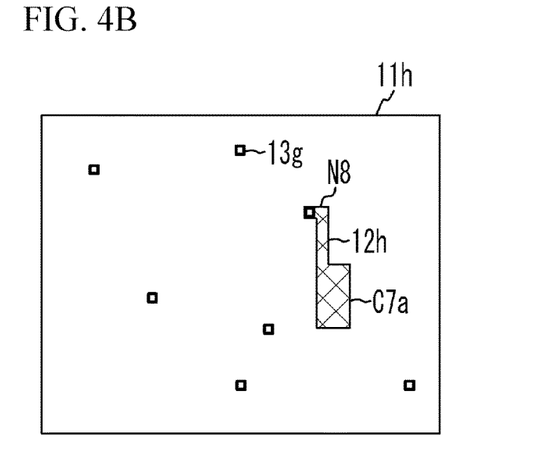
Figure 4C:
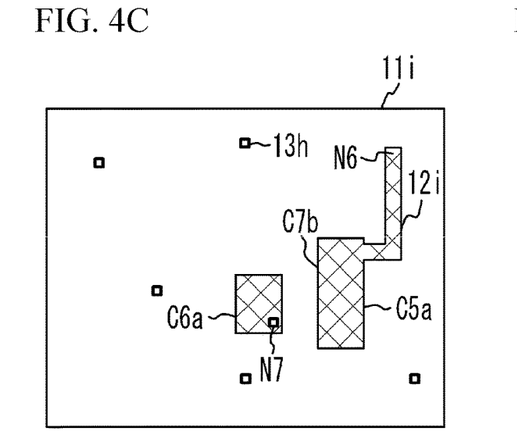
Figure 4D:
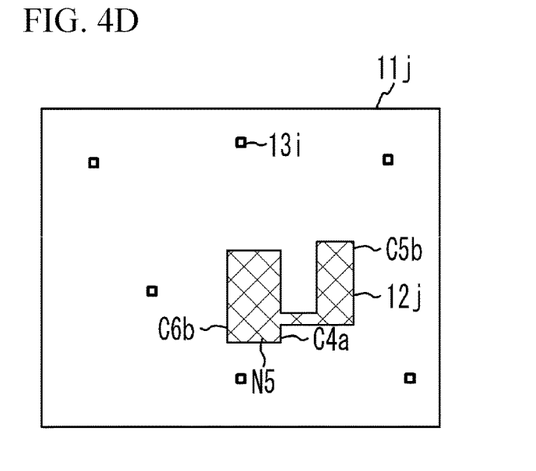
Figure 4E:
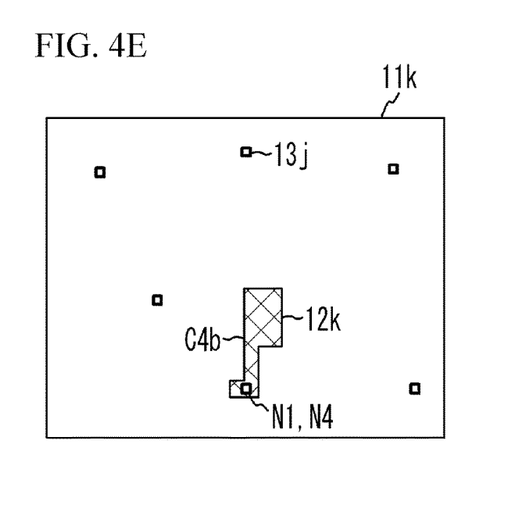
Figure 5A:
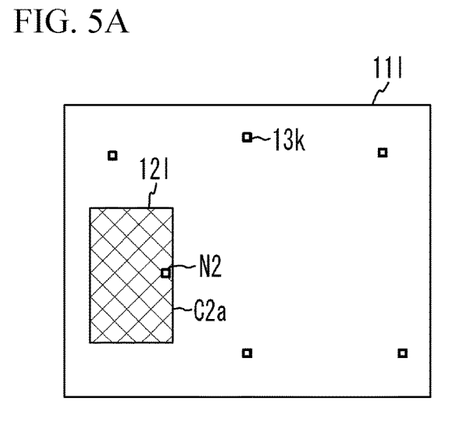
FIG. 5A through FIG. 5F are plan views illustrating each dielectric layer in the multilayered body of the multiplexer in accordance with the first embodiment.
Figure 5B:
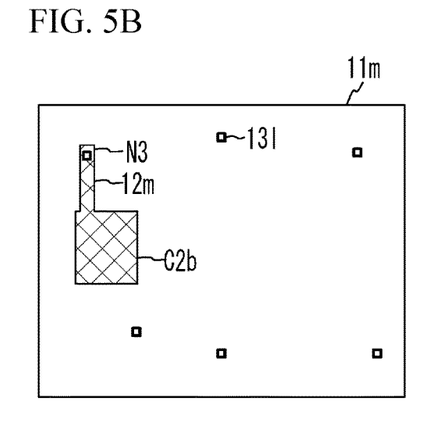
Figure 5C:
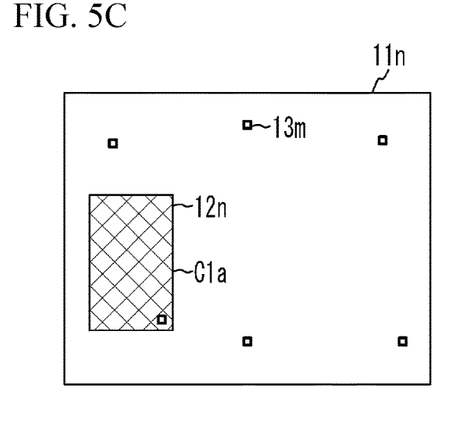
Figure 5D:
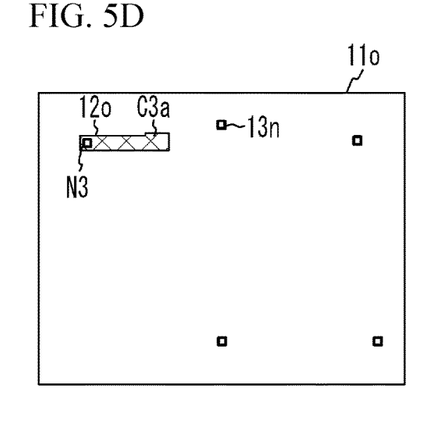
Figure 5E:
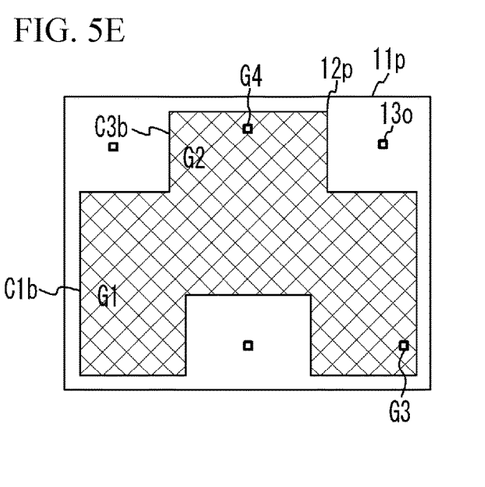
Figure 5F:
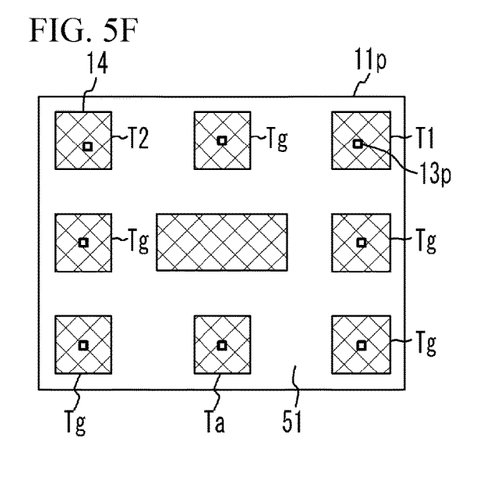

FIG. 3A through FIG. 5F are plan views illustrating each dielectric layer in the multilayered body 10 of the multiplexer in accordance with the first embodiment. FIG. 3A through FIG. 5E are plan views respectively illustrating conductive patterns 12a to 12p respectively disposed on the upper surfaces of dielectric layers 11a to 11p. FIG. 5F is a plan view of the terminals 14 disposed on the lower surface of the dielectric layer 11p as transparently viewed from above. FIG. 3C through FIG. 5F respectively illustrate via wirings 13b to 13p respectively penetrating through the dielectric layers 11b to 11p. FIG. 3A through FIG. 5F illustrate portions that correspond to each node N1 to N8 and each ground G1 to G4. The dimension of each dielectric layer 11a to 11p is, for example, 2.5 mm×2.0 mm.

As illustrated in FIG. 3A, the conductive pattern 12a, which is used as an orientation identification mark, is disposed on the upper surface 52 of the dielectric layer 11a. As illustrated in FIG. 3B, the conductive pattern 12b, which forms a part L3a of the inductor L3 and a part L4a of the inductor L4, is disposed on the upper surface of the dielectric layer 11b. As illustrated in FIG. 3C, the conductive pattern 12c, which forms the inductor L2, is disposed on the upper surface of the dielectric layer 11c.

As illustrated in FIG. 3D, the conductive pattern 12d, which forms a part L3b of the inductor L3 and a part L4b of the inductor L4, is disposed on the upper surface of the dielectric layer 11d. As illustrated in FIG. 3E, the conductive pattern 12e, which forms a part L3c of the inductor L3, is disposed on the upper surface of the dielectric layer 11e. As illustrated in FIG. 3F, the conductive pattern 12f, which forms a part L1a of the inductor L1, is disposed on the upper surface of the dielectric layer 11f.

As illustrated in FIG. 4A, the conductive pattern 12g, which forms a part L1b of the inductor L1, is disposed on the upper surface of the dielectric layer 11g. As illustrated in FIG. 4B, the conductive pattern 12h, which forms an electrode C7a of the capacitor C7, is disposed on the upper surface of the dielectric layer 11h. As illustrated in FIG. 4C, the conductive pattern 12i, which forms an electrode C5a of the capacitor C5, an electrode C6a of the capacitor C6, and an electrode C7b of the capacitor C7, is disposed on the dielectric layer 11i.

As illustrated in FIG. 4D, the conductive pattern 12j, which forms an electrode C4a of the capacitor C4, an electrode C5b of the capacitor C5, and an electrode C6b of the capacitor C6, is disposed on the upper surface of the dielectric layer 11j. As illustrated in FIG. 4E, the conductive pattern 12k, which forms an electrode C4b of the capacitor C4, is disposed on the upper surface of the dielectric layer 11k.

As illustrated in FIG. 5A, the conductive pattern 12l, which forms an electrode C2a of the capacitor C2, is disposed on the upper surface of the dielectric layer 11l. As illustrated in FIG. 5B, the conductive pattern 12m, which forms an electrode C2b of the capacitor C2, is disposed on the upper surface of the dielectric layer 11m. As illustrated in FIG. 5C, the conductive pattern 12n, which forms an electrode C1*a* of the capacitor C1, is disposed on the upper surface of the dielectric layer 11*n*.

As illustrated in FIG. 5D, the conductive pattern 12*o*, which forms an electrode C3*a* of the capacitor C3, is disposed on the upper surface of the dielectric layer 11*o*. As illustrated in FIG. 5E, the conductive pattern 12*p*, which forms a ground electrode G electrically connected to the ground terminal Tg through the via wiring 13*p*, is disposed on the upper surface of the dielectric layer 11*p*. A part of the ground electrode G may be used as an electrode C1*b* of the capacitor C1 and an electrode C3*b* of the capacitor C3. As illustrated in FIG. 5F, the terminals 14 used as the common terminal Ta, the terminals T1 and T2, and the ground terminals Tg are disposed on the lower surface 51 of the dielectric layer 11*p*.

The filters 20 and 21 are provided in the multilayered body 10 as seen above. The terminals T1 and T2, the common terminal Ta, and the ground terminals Tg are disposed on the surface of the multilayered body 10.

The dielectric layers 11*a* to 11*f* are made of a ceramic material, and contain, for example, an oxide of Si, Ca, and Mg (for example, $CaMgSi_2O_6$ that is a diopside crystal) as a main component. The main component of the dielectric layers 11*a* to 11*f* may be an oxide of an element other than Si, Ca, and/or Mg. Furthermore, the dielectric layers 11*a* to 11*f* may contain, as an insulating material, an oxide of at least one of Ti, Zr, and Al.

The conductive patterns 12*a* to 12*f*, the via wirings 13*b* to 13*p*, and the upper parts of the terminals 14 are formed of metal layers mainly composed of, for example, Ag, Pd, Pt, Cu, Ni, Au, an Au—Pd alloy, or an Ag—Pt alloy. The upper parts of the terminals 14 may contain a non-conductive material such as, but not limited to, $TiO_2$, $ZrO_2$, or $Al_2O_3$ in addition to the above metal material. The lower parts of the terminals 14 are formed of a Ni film and a Sn film.

In a case where the multiplexer 100 is mounted on a mounting board, the characteristics of the inductors L1 to L4 such as a Q value may deteriorate due to eddy-current loss if a ground electrode of the mounting board exists near the inductors L1 to L4. Furthermore, parasitic capacitances between the inductors L1 to L4 and the ground electrode may change the characteristics of these inductors. For example, the inductances of the inductors L1 to L4 decrease. This changes the filter characteristics. In order to reduce the change in the filter characteristics, the capacitors C1 to C7 electrically connected to the inductors L1 to L4 are formed in layers lower than layers in which the inductors L1 to L4 are formed, and the ground electrodes G1 to G4 (a ground pattern shown in FIG. 5E) are structurally disposed between the capacitors C1 to C7 and the terminals 14. This configuration increases the distance between the ground electrode of the mounting board and the inductors L1 to L4. Consequently, the change in the characteristics of the inductors L1 to L4 due to the ground electrode is reduced, and thereby, the change in the filter characteristics is reduced.

In some cases, a shield electrode may be arranged above the multiplexer 100 when the multiplexer 100 is mounted on the mounting board. Since the inductors L1 to L4 are arranged in an upper part of the multilayered body 10, the distances between the shield electrode and the inductors L1 to L4 are short. This changes the characteristics of the inductors L1 to L4, thereby changing the filter characteristics. Particularly, the change in the filter characteristics of the filter 20 due to the changes in the characteristics of the inductors L1 and L2 is larger than that of the filter 21.

Simulation

Changes in the characteristics of filters A, B, and C as the filter 20 were three-dimensionally simulated for a case where a shield electrode 24 is provided above the multiplexer and a case where the shield electrode 24 is not provided above the multiplexer.

Figure 6A:
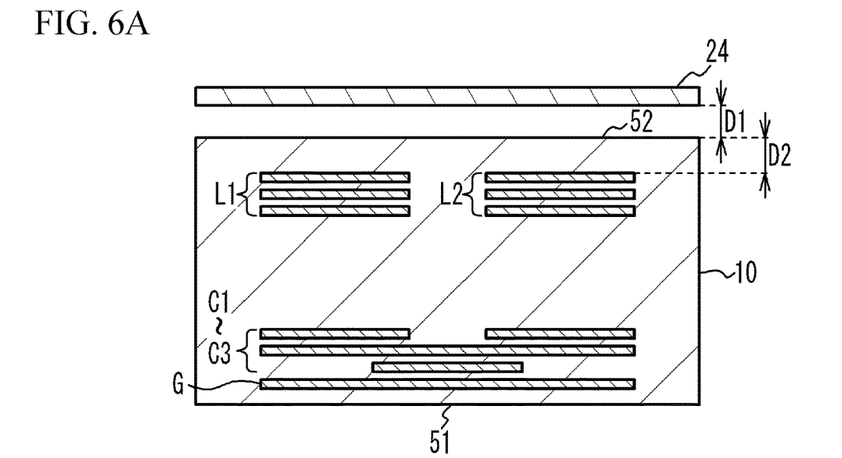
FIG. 6A through FIG. 6C are schematic cross-sectional views of simulated filters A to C.
Figure 6B:
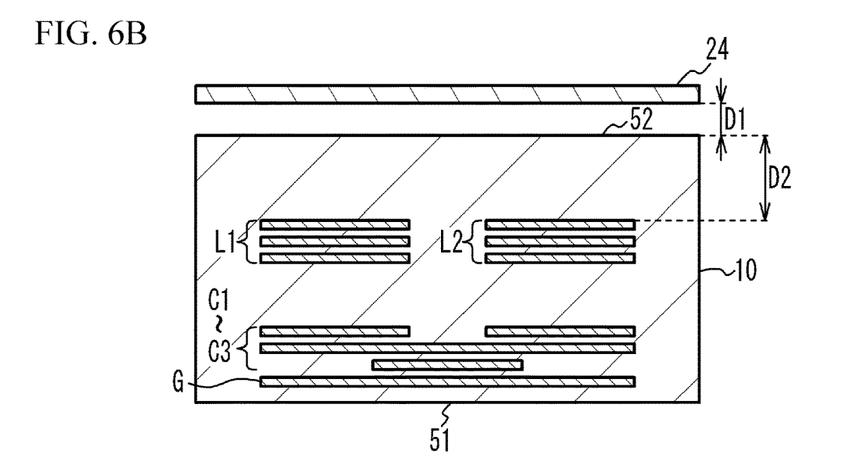
Figure 6C:
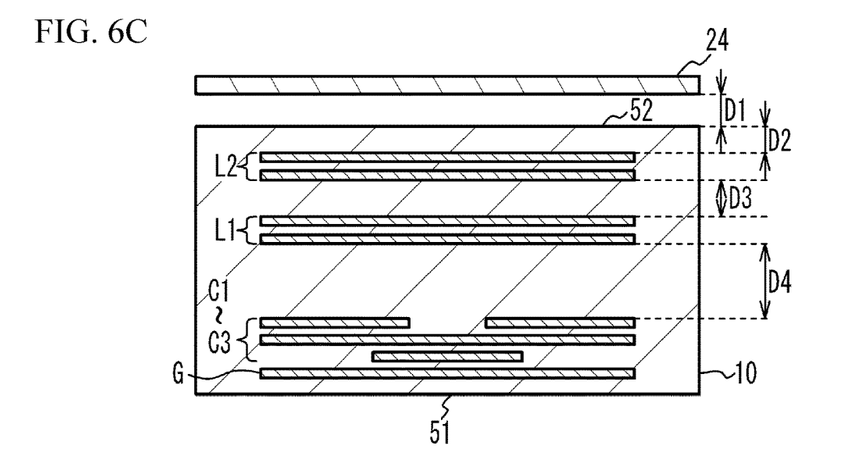

FIG. 6A through FIG. 6C are schematic cross-sectional views of the simulated filters A to C. As illustrated in FIG. 6A through FIG. 6C, the inductors L1 and L2, the capacitors C1 to C3, and the ground electrode G are arranged in the multilayered body 10. The inductors L1 and L2 are disposed higher than the capacitors C1 to C3 in the stacking direction. The shield electrode 24 is arranged above the multilayered body 10. A distance D1 between the shield electrode 24 and the upper surface 52 of the multilayered body 10 is approximately 50 μm.

As illustrated in FIG. 6A, in the filter A, the inductors L1 and L2 are arranged at the same height. A distance D2 between the upper surface 52 of the multilayered body 10 and the uppermost parts of the inductors L1 and L2 is approximately 50 μm.

As illustrated in FIG. 6B, in the filter B, the inductors L1 and L2 are arranged at the same height. The distance D2 between the upper surface 52 of the multilayered body 10 and the uppermost parts of the inductors L1 and L2 is approximately 350 μm.

As illustrated in FIG. 6C, in the filter C, the inductor L2 is interposed between the inductor L1 and the upper surface 52 of the multilayered body 10. The distance D2 between the upper surface 52 of the multilayered body 10 and the uppermost part of the inductor L2 is approximately 50 μm. A distance D3 between the uppermost part of the inductor L1 and the lowermost part of the inductor L2 is approximately 200 μm. A distance D4 between the lowermost part of the inductor L1 and the uppermost parts of the capacitors C1 to C3 is approximately 200 μm.

The filter C was simulated with use of the patterns illustrated in FIG. 3A through FIG. 5F. The filters A and B were simulated under the assumption that each of the inductors and the capacitors had the same size as the corresponding one of the filter C, and the inductors L1 and L2 were arranged as illustrated in FIG. 6A and FIG. 6B.

Figure 7A:
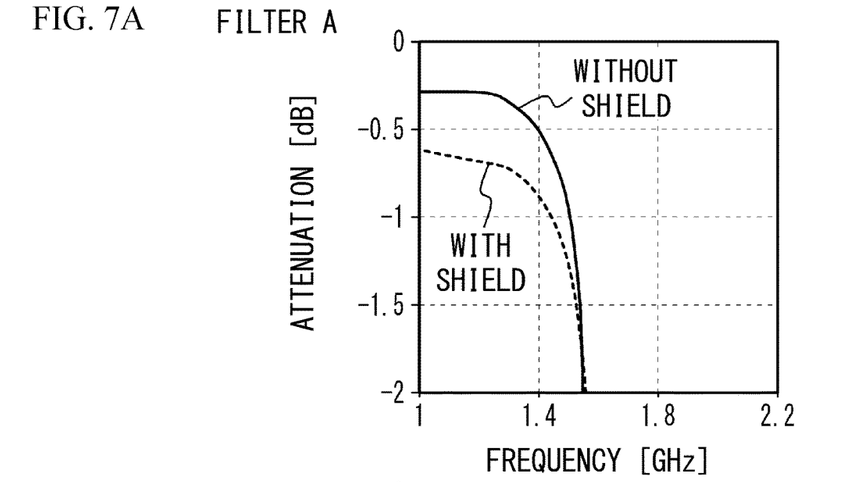
FIG. 7A through FIG. 7C illustrate transmission characteristics of the filters A to C, respectively.
Figure 7B:
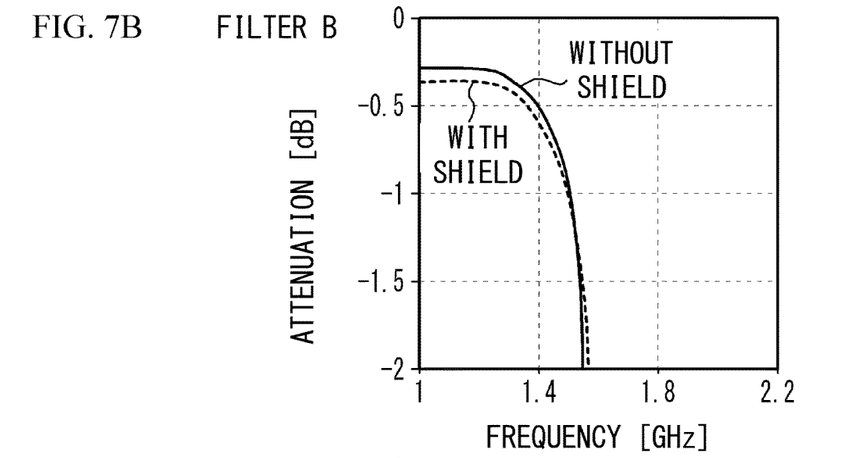
Figure 7C:
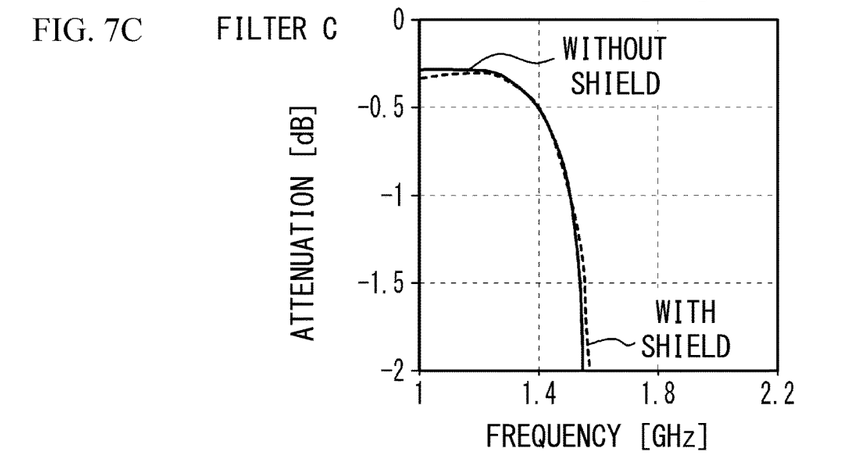

FIG. 7A through FIG. 7C illustrate the transmission characteristics of the filters A to C. A solid line indicates the transmission characteristic of the filter 20 when the shield electrode 24 does not exist. A broken line indicates the transmission characteristic of the filter 20 when the shield electrode 24 exists.

As presented in FIG. 7A, when the shield electrode 24 exists, the transmission characteristic greatly changes in the filter A. When the shield electrode 24 does not exist, the loss at 1.5 GHz is 0.94 dB, whereas the loss at 1.5 GHz is 1.28 dB when the shield electrode 24 exists. As seen above, the loss increases when the shield electrode 24 is provided in the filter A.

As presented in FIG. 7B, even when the shield electrode 24 exists, the change in the transmission characteristic is comparatively small in the filter B. The loss at 1.5 GHz in the presence of the shield electrode 24 is 1.03 dB. In the filter B, the deterioration in the filter characteristics in the presence of the shield electrode 24 is comparatively small because the distance between the shield electrode 24 and the inductors L1 and L2 is larger than that in the filter A. However, the filter characteristic slightly deteriorates.

As presented in FIG. 7C, the transmission characteristic in the filter C is hardly changed even when the shield electrode 24 is provided. The loss at 1.5 GHz in the presence of the shield electrode 24 is 0.96 dB, which is nearly equal to the loss of 0.94 dB in the absence of the shield electrode 24. The loss in the filter C is smaller than that of the filter B.

When the inductors L1 and L2 are stacked as in the filter C, the parasitic capacitance between the inductor L2 and the shield electrode 24 is comparatively large. However, the parasitic capacitance between the inductor L1 and the shield electrode 24 is comparatively small. This is considered the reason why the shield electrode 24 becomes less likely to affect the filter characteristic.

In particular, the inductor L2 is less affected by a parasitic capacitance between the inductor L2 and the shield electrode 24 because the ground capacitance C1 that is connected to the inductor L2 via the node N2 (which is an end of the inductor L2 on a side electrically closer to the common terminal Ta) is designed to have a sufficiently large capacitance as compared with that of the parasitic capacitance. Thus, the inductor L2 is preferably provided between the inductor L1 and the shield electrode 24.

Figure 8:
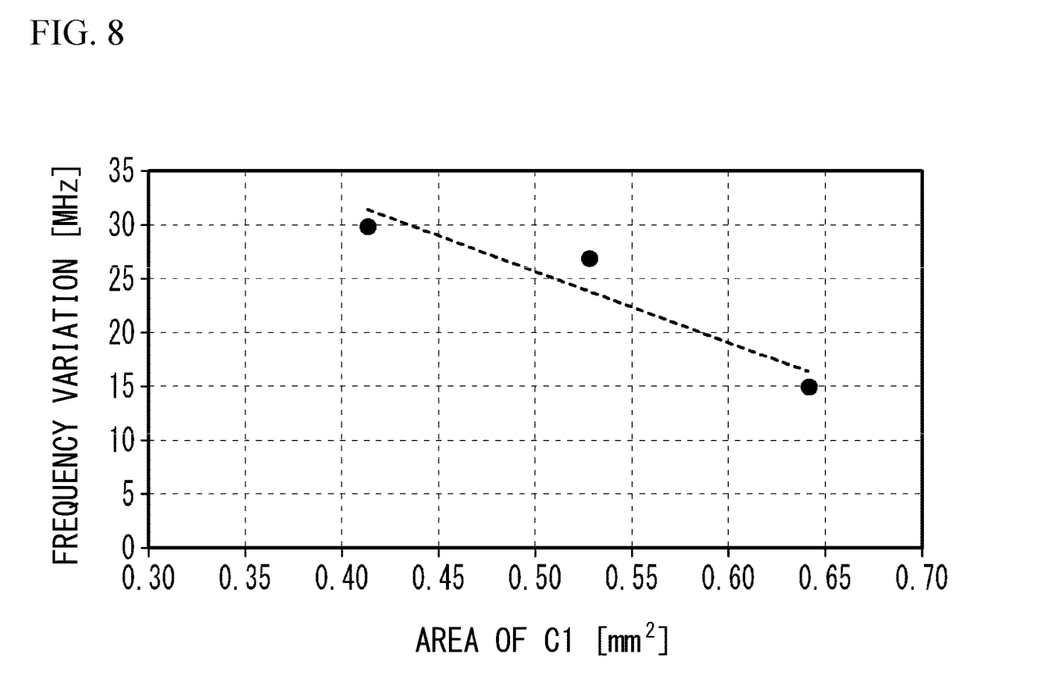
FIG. 8 is a graph of frequency variation versus the area of a capacitor C1 in the filter C.

FIG. 8 is a graph of frequency variation versus an area of the capacitor C1 in the filter C. The area of the capacitor C1 corresponds to the area of the electrode C1a. The frequency variation indicates the frequency variation in the cut-off frequency of the filter C between the presence and the absence of the shield electrode 24. Dots are points where the simulation was conducted, and a broken line is an approximate straight line. As presented in FIG. 8, as the area of the capacitor C1 increases (that is, the capacitance increases), the frequency variation decreases. As seen above, as the capacitance between the node N2 and the ground terminal Tg increases, the change in the filter characteristic due to the shield electrode 24 decreases.

The multiplexer 100 in accordance with the first embodiment includes the filter 21 (a first filter) electrically connected between the common terminal Ta and the terminal T1 (a first terminal), and the filter 20 (a second filter) electrically connected between the common terminal Ta and the terminal T2 (a second terminal). The filter 20 includes the inductor L1 (a first inductor) electrically connected between the common terminal Ta and the terminal T2, and the inductor L2 (a second inductor) connected in series with the inductor L1 between the inductor L1 and the terminal T2. At least a part of the inductor L2 overlaps with at least a part of the inductor L1 in the stacking direction. The capacitance C1 between the node N2 (a first end electrically closer to the common terminal Ta of the inductor L2) and the ground terminal Tg is larger than the capacitance C0 between the node N1 (a first end electrically closer to the common terminal Ta of the inductor L1) and the ground terminal Tg.

The change in the characteristics due to the presence or absence of the shield electrode 24 is reduced by overlapping the inductor L2 having a comparatively large ground capacitance with the inductor L1 as described above.

In this disclosure, a parasitic capacitance can be calculated by using an electromagnetic field simulator such as the high frequency structure simulator (HFSS) offered by ANSYS Inc., for example. For example, when the capacitance C0 is a parasitic capacitance as in the example described above, the S parameters are calculated using the HFSS by varying the distance between the shield electrode 24 and the multilayered body 10 and the area of the shield electrode 24. Then, the parasitic capacitance C0 can be calculated based on the calculated S parameters.

The state where at least a part of the inductor L2 overlaps with at least a part of the inductor L1 in the stacking direction includes a state where regions surrounded by the conductive patterns that form the inductors L1 and L2 overlap with each other. That is, at least a part of the conductive pattern that forms the inductor L1 and/or at least a part of the region surrounded by the above conductive pattern overlap with at least a part of the conductive pattern that forms the inductor L2 and/or at least a part of the region surrounded by the above conductive pattern in the stacking direction.

The capacitors C1 to C3 are disposed near the lower surface 51 of the multilayered body 10 to be mounted on the mounting board. The inductors L1 and L2 are disposed away from the lower surface 51. This structure reduces the change in the characteristics of the inductors L1 and L2 due to, for example, the ground terminal in the mounting board. However, when the shield electrode 24 exists above the upper surface 52 of the multilayered body 10, the characteristics of the inductors L1 and L2 change.

In order to reduce this change, in such an arrangement that the capacitors C1 to C3, including the capacitor C1 electrically connected between the node N2 and the ground terminal Tg, are interposed between the inductor L1 and the lower surface 51 (a first surface) of the multilayered body 10 and between the inductor L2 and the lower surface 51 in the stacking direction, the inductor L2 is interposed between the inductor L1 and the upper surface 52 (a second surface) of the multilayered body 10 in the stacking direction.

Accordingly, the inductor L2 having the comparatively large ground capacitance is interposed between the inductor L1 and the upper surface 52. This structure reduces the change in the characteristics of the inductors L1 and L2 due to the ground terminal in the mounting board arranged below the lower surface 51 and the shield electrode 24 that exists above the upper surface 52. The capacitor may be electrically connected between the node N1 and the ground terminal Tg and/or between the node N2 and the ground terminal Tg.

One end of the capacitor C1 is electrically connected to the node N2 between the inductors L1 and L2, and the other end thereof is electrically connected to the ground terminal Tg. To make the filters 20 and 21 have substantially opposite phases, the ground capacitance of the node N1 and the ground inductance of the node N4 are preferably reduced. Thus, no capacitor is electrically connected between the node N1 and the ground terminal Tg to form the capacitance C0 of only the parasitic capacitance, or a capacitor having a smaller capacitance than the capacitor C1 may be physically formed in the multilayered body 10 below the first inductor L1 and electrically connected between the node N1 and the ground terminal Tg. As seen above, the inductor L2 having the comparatively large ground capacitance is preferably arranged closer to the upper surface 52 than the inductor L1.

The inductors L1 and L2 have a spiral shape or a helical shape. The winding direction of the inductor L1 viewed from the common terminal Ta to the terminal T2 in the stacking direction is the same as the winding direction of the inductor L2 viewed from the common terminal Ta to the terminal T2 in the stacking direction. As exemplified in FIG. 3C, the winding direction of the inductor L2 viewed from the common terminal Ta to the terminal T2 (i.e., from the node N2 to the node N3) is clockwise. As illustrated in FIG. 3F and FIG. 4A, the winding direction of the inductor L1 viewed from the common terminal Ta to the terminal T2 (i.e., from the node N1 to the node N2) is clockwise. In such an arrangement that the winding directions of the inductors L1 and L2 are the same, the capacitor C1 may be designed to be larger than that used in such an arrangement that the winding directions are opposite to each other. This configuration reduces the change in the characteristics of the inductors L1 and L2.

The common terminal Ta, the terminal T1, the terminal T2, and the ground terminals Tg are arranged on the lower surface 51 of the multilayered body 10. In this case, the lower surface 51 is mounted on the mounting board. The above arrangement reduces the change in the characteristics of the inductors L1 and L2 due to the presence of the ground electrode in the mounting board that exists below the lower surface 51 and the shield electrode 24 that exists above the upper surface 52.

No shield electrode is provided between the upper surface 52 of the multilayered body 10 and the inductor L2. In the absence of the shield electrode above the inductor L2 in the multilayered body 10, the characteristics of the inductors L1 and L2 change depending on whether the shield electrode 24 exists above the multilayered body 10 or not. Thus, it is preferable to arrange, between the upper surface 52 of the multilayered body 10 and the inductor L1, the inductor L2 having the sufficiently large ground capacitance as compared with the parasitic capacitance between the inductor L2 and the shield electrode 24.

In the above-described multiplexer 100, the filter 20 is a low-pass filter and the filter 21 is a high-pass filter. A variation of the multiplexer may have the filter 21 that is a bandpass filter. The passband of the filter 20 is lower than the passband of the filter 21. Thus, the multiplexer 100 functions as a diplexer. The filter 20 may include three or more inductors connected in series between the common terminal Ta and the terminal T2. For example, the filter 20 may include an inductor having a first end electrically connected to the node N3 and a second end electrically connected to the terminal T2. The filter 21 may have a structure other than that in the first embodiment.

The first embodiment describes a diplexer as the multiplexer, but the multiplexer may be a triplexer or a quadplexer. Although the first embodiment describes an example of the multiplexer, the multilayered body 10 may have a structure that includes the filter 20 but not the filter 21. In this structure, the common terminal Ta may be used as a first signal terminal electrically connected to the common terminal Ta, and the terminal T2 may be used as a second signal terminal.

Second Embodiment

Figure 9:
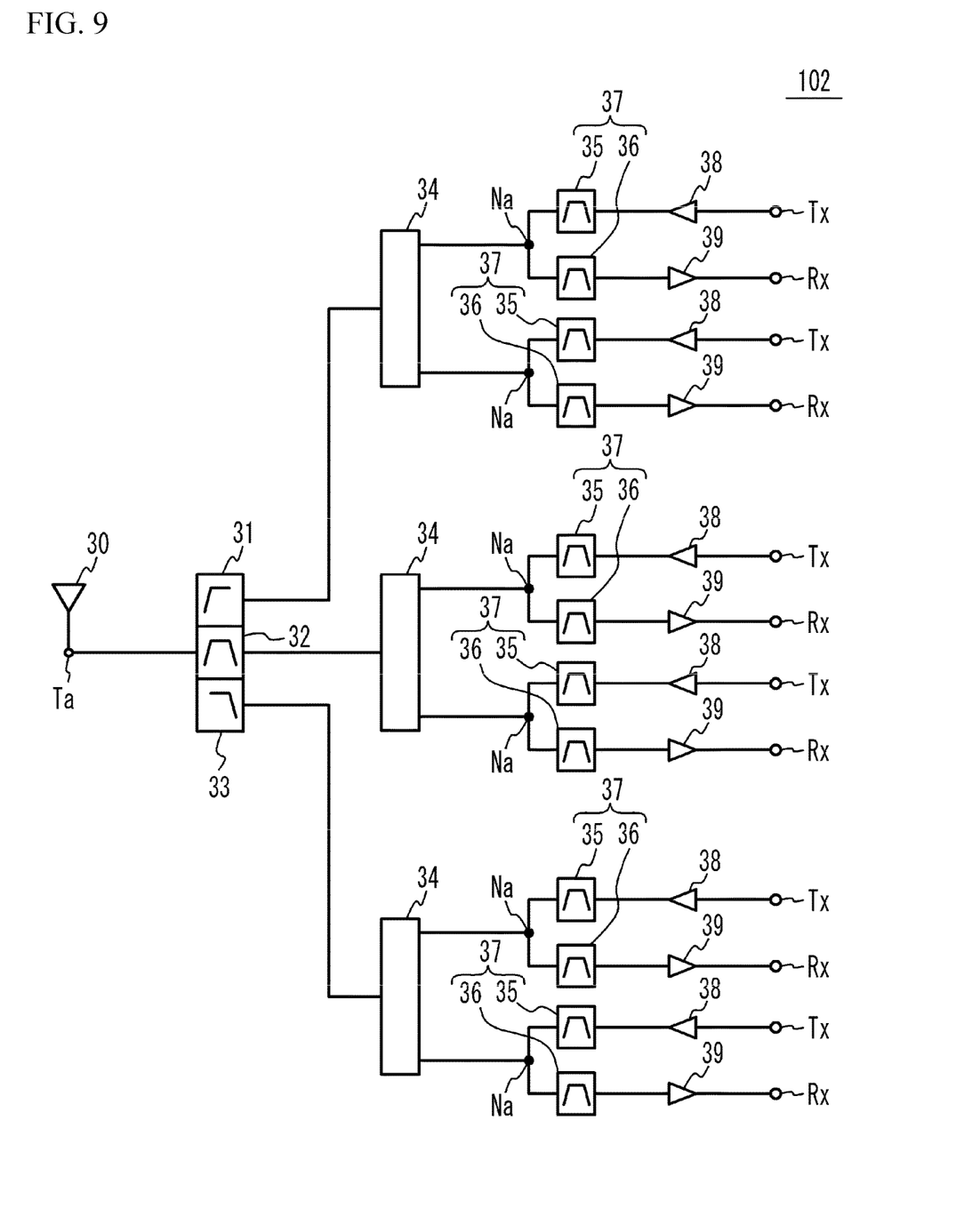
FIG. 9 is a circuit diagram of a front end circuit including a communication module in accordance with a second embodiment.

A second embodiment is an exemplary communication module to which the first embodiment is applied. FIG. 9 is a circuit diagram of a front end circuit including the communication module in accordance with the second embodiment. As illustrated in FIG. 9, a front end circuit 102 includes a high-pass filter (HPF) 31, a bandpass filter (BPF) 32, a low-pass filter (LPF) 33, switches 34, duplexers 37, power amplifiers (PAs) 38, and low noise amplifiers (LNAs) 39.

An antenna 30 is coupled to the common terminal Ta. First ends of the HPF 31, the BPF 32, and the LPF 33 are commonly connected to the common terminal Ta. The switches 34 are coupled to second ends of the HPF 31, the BPF 32, and the LPF 33. The HPF 31 allows high-frequency signals in a high band to pass therethrough, and suppresses signals with other frequencies. The BPF 32 allows high frequency signals in a middle band of which the frequency is lower than that of the high band to pass therethrough, and suppresses signals with other frequencies. The LPF 33 allows high frequency signals in a low band of which the frequency is lower than that of the middle band to pass therethrough, and suppresses signals with other frequencies.

Common nodes Na of the duplexers 37 are coupled to the switch 34. Each switch 34 selects one duplexer 37 from among the duplexers 37, and connects the selected duplexer 37 to the corresponding one of the second ends of the HPF 31, the BPF 32, and the LPF 33. The duplexer 37 includes a transmit filter 35, which is a BPF, and a receive filter 36, which is a BPF. The transmit filter 35 is connected to the PA 38, and the receive filter 36 is connected to the LNA 39.

Transmission signals input to a transmit terminal Tx are amplified by the PA 38. The transmit filter 35 outputs high-frequency signals in the transmit band to the common node Na among the amplified signals, and suppresses signals with other frequencies. The filtered transmission signal passes through the switch 34 and the HPF 31, the BPF 32, or the LPF 33 to be output from the antenna 30.

Reception signals input to the antenna 30 pass through the HPF 31, the BPF 32, or the LPF 33 and the switch 34. The receive filter 36 allows signals in the receive band to pass therethrough among high frequency signals input to the common node Na, and suppresses signals with other frequencies. The filtered reception signal is amplified by the LNA 39, and is then output to the receive terminal Rx.

The communication module may incorporate a multiplexer including the LPF 33 that is the filter 20 of the first embodiment and the HPF 31 and/or the BPF 32 that is the filter 21 of the first embodiment, and other components of the front end circuit 102.

Figure 10A:
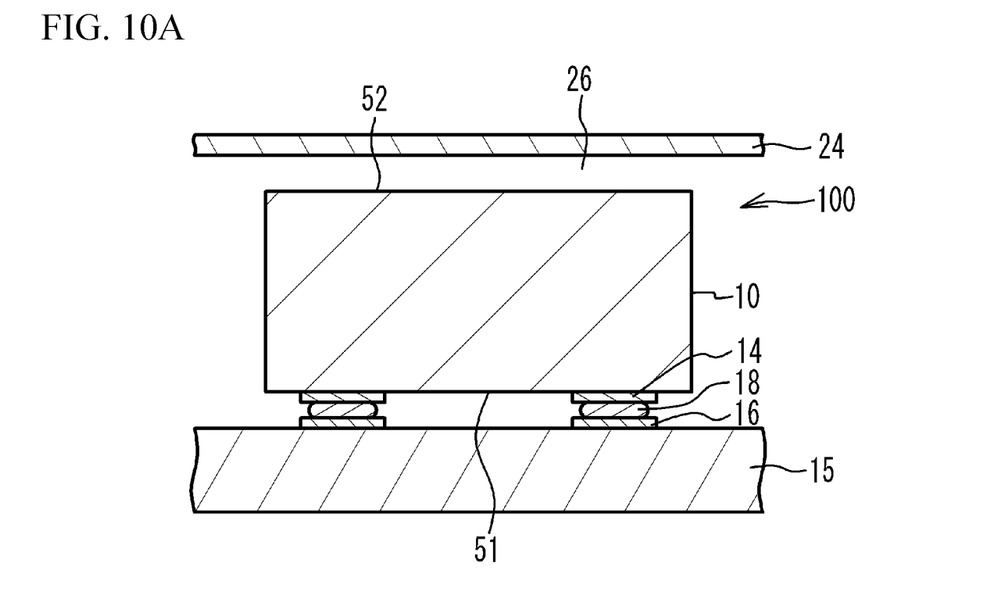
FIG. 10A and FIG. 10B are cross-sectional views of the communication module in accordance with the second embodiment.
Figure 10B:
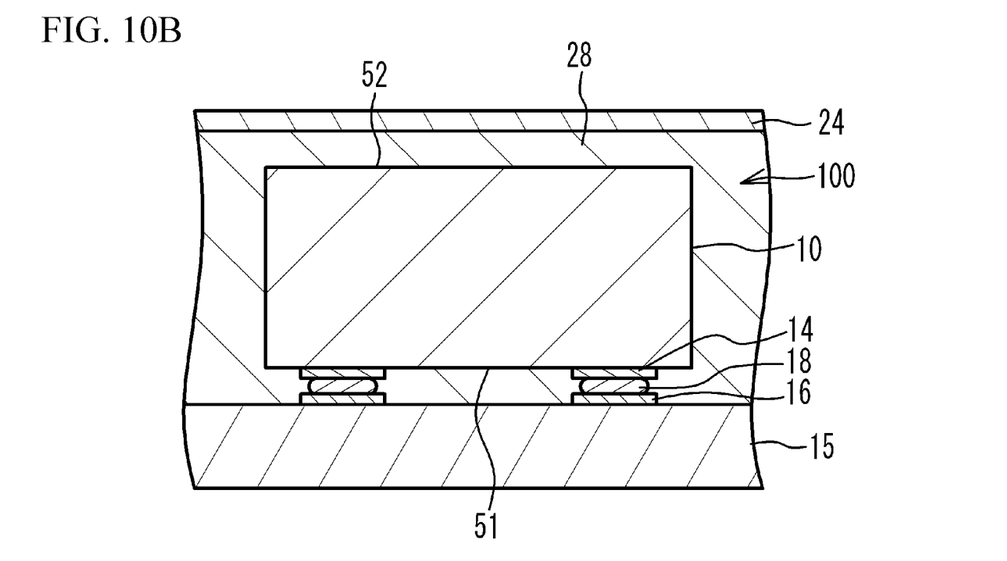

FIG. 10A and FIG. 10B are cross-sectional views of the communication module in accordance with the second embodiment. As illustrated in FIG. 10A and FIG. 10B, the multiplexer 100 is mounted on a mounting board 15. The terminal 14 of the multilayered body 10 is bonded to a terminal 16 formed on the upper surface of the mounting board 15 via solder 18. The shield electrode 24 is provided above the upper surface 52 of the multilayered body 10. In FIG. 10A, the shield electrode 24 is provided above the upper surface 52 of the multilayered body 10 with an air gap 26 interposed between the shield electrode 24 and the upper surface 52. In FIG. 10B, the shield electrode 24 is provided above the upper surface 52 with an insulator 28 (resin, for example) made of a material different from that of the multilayered body 10 interposed between the shield electrode 24 and the upper surface 52. A ground electrical potential, for example, is applied to the shield electrode 24.

In the communication module in the second embodiment, the shield electrode 24 is provided above the upper surface 52 of the multilayered body 10. However, the use of the multiplexer of the first embodiment reduces the change and the deterioration in the characteristics of the filter 20.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:
1. A multiplexer comprising:
    a multilayered body including a plurality of dielectric layers stacked in a vertical staking direction;
    a common terminal, a first terminal, a second terminal, and a ground terminal that are disposed on a bottom surface of the multilayered body and that are not disposed on a top surface of the multilayered body;
    a first filter constructed within the multilayered body and electrically connected between the common terminal and the first terminal; and a second filter constructed within the multilayered body, including:
- a first inductor constructed within the multilayered body, disposed in an electrical path connecting the common terminal to the second terminal, and
- a second inductor constructed within the multilayered body, connected in series with the first inductor between the common terminal and the second terminal and along said electrical path between the first inductor and the second terminal, at least a part of the second inductor overlapping with at least a part of the first inductor in the stacking direction, a capacitance formed between a first end of the second inductor connected to the first inductor and the ground terminal being larger than a capacitance formed between a first end of the first inductor that is closer to the common terminal along said electrical path and the ground terminal, wherein at least one of the capacitance formed between the first end of the second inductor and the ground terminal and the capacitance formed between the first end of the first inductor and the ground terminal is generated by a first capacitor having two opposing first capacitor electrodes sandwiching one or more of the dielectric layers in between and electrically connected between the ground terminal and the first end of the second inductor or the first end of the first inductor, wherein the capacitor is disposed between the bottom surface and the first inductor, and the second inductor is disposed between the first inductor and the top surface, and wherein no inductor is connected in parallel with the capacitance formed between the first end of the second inductor and the ground terminal.

2. The multiplexer according to claim 1, wherein the capacitance formed between the first end of the second inductor and the ground terminal is generated by said first capacitor having the two opposing first capacitor electrodes sandwiching said one or more of the dielectric layers in between and electrically connected between the first end of the second inductor and the ground terminal.

3. The multiplexer according to claim 1, wherein no shield electrode is interposed between the top surface of the multilayered body and the second inductor.

4. The multiplexer according to claim 1, wherein the first filter is one of a high-pass filter and a bandpass filter, and the second filter is a low-pass filter of which a passband is lower than a passband of the first filter.

5. A communication module, comprising:
a multiplexer according to claim 1; and
a shield electrode provided above the top surface, one of an air gap and an insulator being interposed between the shield electrode and a top surface of the multilayered body, the insulator being made of a material different from a material of the multilayered body.

6. The multiplexer according to claim 1, further comprising a second capacitor has two opposing second capacitor electrodes sandwiching one or more of the dielectric layers in between and electrically connected between the ground terminal and the second end of the second inductor.

7. The multiplexer according to claim 6, wherein the second capacitor is disposed between the bottom surface and the first inductor.

8. A multiplexer comprising:
a multilayered body including a plurality of dielectric layers stacked in a vertical staking direction;
a common terminal, a first terminal, a second terminal, and a ground terminal that are disposed on a surface of the multilayered body;
a first filter constructed within the multilayered body and electrically connected between the common terminal and the first terminal; and
a second filter constructed within the multilayered body, including:
- a first inductor constructed within the multilayered body, disposed in an electrical path connecting the common terminal to the second terminal, and
- a second inductor constructed within the multilayered body, connected in series with the first inductor along said electrical path between the first inductor and the second terminal, at least a part of the second inductor overlapping with at least a part of the first inductor in the stacking direction, a capacitance formed between a first end of the second inductor connected to the first inductor and the ground terminal being larger than a capacitance formed between a first end of the first inductor that is closer to the common terminal along said electrical path and the ground terminal, wherein the capacitance formed between the first end of the second inductor and the ground terminal is generated by said capacitor having the two opposing capacitor electrodes sandwiching said one or more of the dielectric layers in between and electrically connected between the first end of the second inductor and the ground terminal, wherein the first inductor and the second inductor each have one of a spiral shape and a helical shape, and wherein a winding direction of the first inductor from the first end thereof to an opposite end of the first inductor is the same as a winding direction of the second inductor from the first end thereof to an opposite end of the second inductor.

9. A multiplexer comprising:
a multilayered body including a plurality of dielectric layers each having a conductive pattern or patters thereon, stacked in a vertical staking direction;
a common terminal, a first terminal, a second terminal, and a ground terminal that are disposed on a bottom surface of the multilayered body and that are not disposed on a top surface of the multilayered body;
a first filter constructed of a set of the conductive patterns on the plurality of dielectric layers in the multilayered body and electrically connected between the common terminal and the first terminal; and
a second filter constructed of another set of the conductive patterns on the plurality of dielectric layers in the multilayered body, the second filter including:
a first inductor formed in the multilayered body, one end of the first inductor being connected to the common terminal;
a second inductor formed in the multilayered body having one end thereof connected to another end of the first inductor so as to be connected in series with the first inductor, another end of the second inductor being connected to the second terminal, the second inductor being formed in a layer or layers that are above a layer or layers in which the first inductor is formed such that the second inductor at least partially overlaps with the first inductor in a plan view; and
a first capacitor formed in the multilayered body, connected between the ground terminal and a node that connects the first inductor and the second inductor in series, the first capacitor being formed in layers that are below the layer or layers in which the first inductor is formed, and having a capacitance that is greater than a capacitance formed between the ground terminal and said one end of the first inductor connected to the common terminal, said capacitance formed between the ground terminal and said one end of the first inductor being formed only by a parasitic capacitance formed within the multilayered body, or formed by another capacitor physically formed within the multilayered body, connected between the ground terminal and said one end of the first inductor, wherein no inductor is connected in parallel with the first capacitor between the ground terminal and the node.

10. The multiplexer according to claim 9, further comprising a second capacitor physically formed within the multilayered body and electrically connected between the ground terminal and said another end of the second inductor in series.

11. The multiplexer according to claim 10, wherein the second capacitor is formed in the layers that are below the layer or layers in which the first inductor is formed.

* * * * *